United States Patent
Ota et al.

(10) Patent No.: US 6,314,785 B1
(45) Date of Patent: Nov. 13, 2001

(54) APPARATUS FOR PRODUCING A PLATED PRODUCT HAVING RECESSES

(75) Inventors: Kunio Ota, Toyohashi; Hitoshi Rokutanda; Hiroaki Suzuki, both of Toyokawa; Shinobu Kato, Nagoya; Seietsu Abe, Toyokawa, all of (JP)

(73) Assignee: Sintokogio, Ltd., Aichi Prefecture (JP)

( * ) Notice: Subject to any disclaimer, the term of this patent is extended or adjusted under 35 U.S.C. 154(b) by 0 days.

(21) Appl. No.: 09/538,096

(22) Filed: Mar. 29, 2000

Related U.S. Application Data

(62) Division of application No. 09/140,085, filed on Aug. 26, 1998, now Pat. No. 6,180,171.

(30) Foreign Application Priority Data

Aug. 29, 1997 (JP) .................................................. 9-250011
Oct. 9, 1997 (JP) .................................................. 9-293354
May 14, 1998 (JP) .................................................. 10-131824

(51) Int. Cl.[7] .................................................. B21D 28/00
(52) U.S. Cl. .................................................. 72/325; 72/47
(58) Field of Search .................................................. 72/325, 324, 53, 72/47

(56) References Cited

U.S. PATENT DOCUMENTS

| | | | |
|---|---|---|---|
| 3,937,055 | * 2/1976 | Caruso | 72/53 |
| 4,005,991 | 2/1977 | Uebayasi et al. | 29/196.2 |
| 4,641,510 | * 2/1987 | Mitsching | 72/53 |
| 4,774,122 | 9/1988 | Adler | 428/156 |
| 5,435,889 | 7/1995 | Dietrich | 216/63 |
| 5,553,476 | * 9/1996 | Ochy | 72/325 |
| 5,713,895 | * 2/1998 | Lontine | 606/41 |
| 5,927,136 | * 7/1999 | Reynolds | 72/325 |

FOREIGN PATENT DOCUMENTS

| | | | |
|---|---|---|---|
| 290394 | * 8/1953 | (CH) | 72/53 |
| 56-27323 | * 6/1981 | (JP) . | |
| 58-55174 | * 12/1983 | (JP) . | |

* cited by examiner

*Primary Examiner*—Daniel C. Crane
(74) *Attorney, Agent, or Firm*—Gray Cary Ware & Freidenrich L.L.P.

(57) ABSTRACT

An apparatus is provided for forming many recesses on the surface of a nonmetallic or metallic material for a plated product. The apparatus comprises a needle or a drawn wire material of a diameter of 3~95 μm, a retainer means for retaining the base portion of the needle or the drawn wire material so that the needle or drawn wire material is inclined at angles of more than 45 degrees, but less than 90 degrees, to said surface of said material, a material-fixing means to fix the material, and a means for raising or lowering the retainer means. In another embodiment a cutting blade is provided.

6 Claims, 7 Drawing Sheets

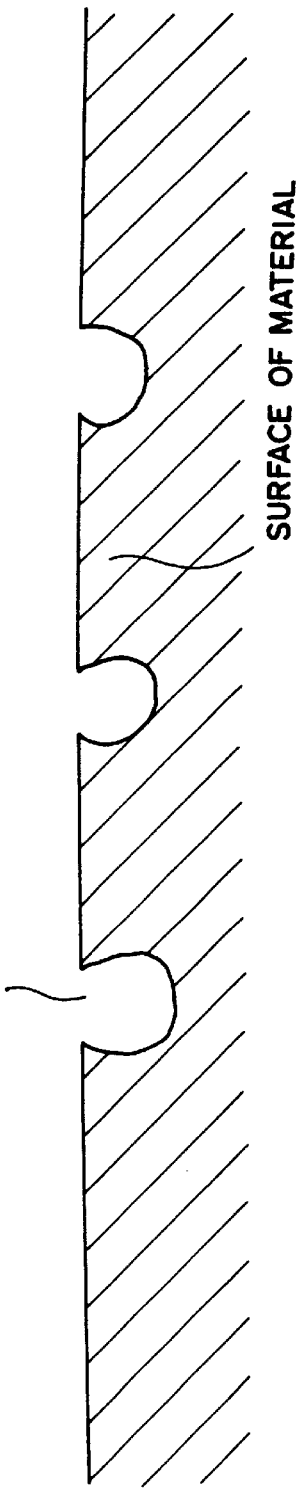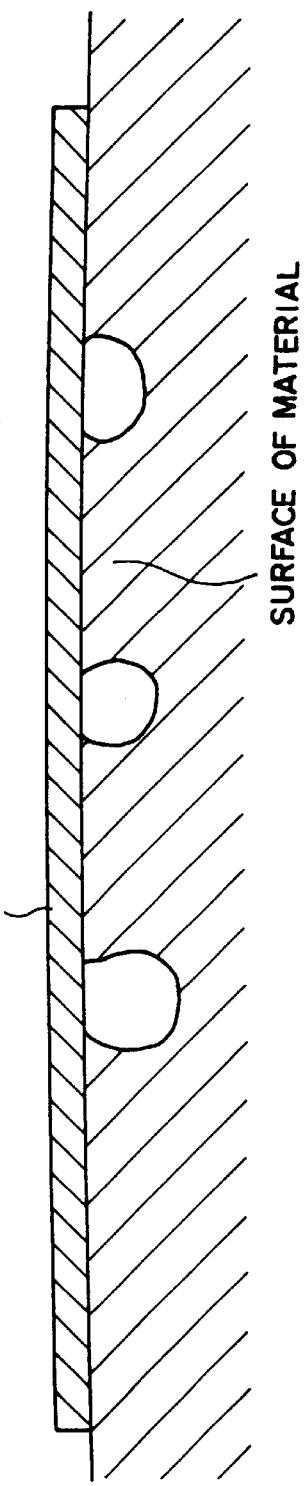

APPARATUS FOR PRODUCING A PLATED PRODUCT HAVING RECESSES

This is a divisional of application Ser. No. 09/140,085, filed Aug. 26, 1998, now U.S. Pat. No. 6,180,171.

BACKGROUND OF THE INVENTION

This invention relates to a plated product in which the surface of a metallic or nonmetallic material is plated, and to a method and apparatus for producing it.

2 Prior Art

When the surface of a metallic or nonmetallic material is to be plated, it has been conventionally attempted to form fine recesses on the material before plating it, so as to enhance the adhesion of the material with a thin film of metal (plating). To form the recesses, various methods have been proposed. For example, in a certain method, fine powder particles are caused to hit the material. In another method, a certain kind of substance or fine particles that are dissolvable in a specified solution are previously embedded near the surface of the material, or mixed with the material, and the substance or fine particles are then dissolved in the solution.

In the former method, the sizes of the fine powder particles range from several tens to several hundreds of $\mu$m. Therefore, the fine recesses are formed by plastic deformation or a cutting force resulting from the collisions of the powder particles with the material to be plated. FIG. 1(a) shows a recess mainly formed by the plastic deformation made by the powder particles hitting the surface of the material at substantially right angles to it. FIG. 1(b) shows a recess mainly formed by the cutting force formed by the powder particles hitting the surface of the material at an acute angle of incidence to the surface. Each of these recesses has a form that opens outwards, like a state after a meteorite has collided with a planet. Therefore, when the surface of the material is plated, the adhesion of the thin film of metal to the surface depends on the thin film of metal's own adhesive force, the resistance due to the uneven surface of the material, and the area of adhesion. Therefore, the following problems have occurred:

When a force is applied in a direction substantially parallel to the surface of the material, not only the thin film of metal's own adhesive force, but also a resistant force (peeling resistance) is generated, in response to the resistance due to the uneven surface of the material, and to the size of the area where the metal adheres to the surface of the material to be plated. When a force is applied at substantially right angles to the surface of the material, the adhesion of the thin film of metal to the surface of the material depends only on the adhesion force of the thin film of metal, and the resistance due to the uneven surface of the material and the size of the adhered area do not contribute to the retention of the thin film of metal on the surface of the material. Thus, when a mechanically great force such as a strong hitting force is applied to a part of the plated surface, a phenomenon of fine peeling occurs on that part of the plating. Further, if the force is repeated, then the peeling increases, so that the thin film of metal peels off the material.

In the latter method, the sizes of the fine recesses on the surface of the material depend on the sizes of the substance or the particles embedded or mixed. The sizes of the fine recesses are less than 2~3 $\mu$m. As in FIG. 2 (a), the size of the opening of a recess is small as compared with the size of the entire recess. Therefore, in plating a material, the metal tends not to enter the recess. FIG. 2(b) shows that the thin film of metal only blocks the opening of the recess. This leads to the adhesion of the thin film of metal to the surface of the material depending only on the thin film of metal's own adhesive force. Thus, when a mechanically large force is applied to the plated material, and is applied to a particular point on its surface, at right angles, the thin film of metal at that point peels off the material.

SUMMARY OF INVENTION

This invention has been created to resolve the above problems. Therefore, one object of this invention is to provide a plated product in which the thin film of metal tends not to peel off the surface of the material, and a method and apparatus for producing it.

Another object of this invention is to provide a plated product in which the surface of a metallic or nonmetallic material is plated, that comprises a material of which the surface has many recesses, each having an opening of 5~100 $\mu$m and a depth of 0.2 d~d (d: the diameter of the opening of a recess, $\mu$m), and having an anchor portion, and a thin film of metal which covers the surface of said material and a portion of which film enters each said recess.

Another object of this invention is to provide a method of producing a plated product in which the surface of a metallic or nonmetallic material is plated, that comprises causing the tip of a needle or a drawn wire material of a diameter of 3~95 $\mu$m to penetrate said surface of said material at angles of less than 90 degrees, but more than 45 degrees, withdrawing said needle or said drawn wire material from said material and repeating this process so as to provide at said surface of said material many recesses, each having an opening of 5~100 $\mu$m and a depth of 0.2 d~d (d: the size of the opening of a recess, $\mu$m) and having an anchor portion, and covering said surface of said material that includes said recesses with a thin film of metal.

A further object of this invention is to provide an apparatus for producing a plated product in which the surface of a metallic or nonmetallic material is plated, that comprises a needle or a drawn wire material of a diameter of 3~95 $\mu$m, a retainer means for retaining the base portion of said needle or said drawn wire material so that said needle or drawn wire material is inclined at angles larger than 45 degrees, but less than 90 degrees, to said surface of said material, a material-fixing means to fix the material, and a means for elevating or lowering said retainer means.

Still another object of this invention is to provide a plated product in which the surface of a metallic or nonmetallic material is plated, characterized by a plurality of grooves formed on the surface of said material, the width of the opening of each groove being 5~100 $\mu$m and the depth of each groove being 0.2 b~b (b: said width of the opening, $\mu$m), and the angle of each said groove to the surface of said material being within a range of more than 45 degrees, but less than 90 degrees.

A still further object of this invention is to provide a method of producing a plated product in which the surface of a metallic or nonmetallic material is plated, comprising causing a cutting blade having a thickness of 3~95 $\mu$m to penetrate said surface of said material while said cutting blade is inclined to said surface of said material at angles within a range of more than 45 degrees, but less than 90 degrees, moving said cutting blade or said material to cause them to move relative to each other and repeating this process so as to provide at said surface of said material a plurality of grooves, many running in different directions, the width of the opening of each groove being 5~100 $\mu$m and the depth of each groove being 0.2 b~b (b: said width of the opening, μm), and covering said surface of said material that includes said grooves with a thin film of metal.

Still another object of this invention is to provide an apparatus for forming a plurality of grooves on the surface of a nonmetallic or metallic material for a plated product, comprising a retainer means for retaining the base portion of said cutting blade having a thickness of 3~95 μm so that said cutting blade is inclined to said surface of said material at angles within a range of more than 45 degrees, but less than 90 degrees, a material-fixing means to fix said material, a means for elevating or lowering said retainer, a first moving means to move said retainer means in the direction that the blade of said cutting blade is directed, and a second moving means to move said material-fixing means horizontally.

A still further object of this invention is to provide a plated product in which the surface of a metallic or nonmetallic material is plated, characterized by many grooves formed on the surface of said material, the width of the opening of each groove being 5~100 μm and the depth of each groove being 10~90% of the thickness T of a plated layer, the angle of each said groove to the surface of said material being within a range of more than 30 degrees, but less than 150 degrees, and each groove being provided at each of both edges of its opening with a ridge portion whose height is 10~90% of said thickness T of said plated layer.

Still another object of this invention is to provide a method of producing a plated product in which the surface of a metallic or nonmetallic material is plated, comprising causing a cutting blade having a thickness of 3~95 μm to be pressed on said surface of said material while said cutting blade is inclined to said surface of said material at angles within a range of more than 30 degrees, but less than 150 degrees, and moving said cutting blade or said material to cause them to move relative to each other, and repeating this process so as to provide at said surface of said material many grooves, many running in different directions, the width of the opening of each groove being 5~100 μm, and the depth of each groove being 10~90% of the thickness T of a plated layer or 2~18 μm, and to provide ridge portions, the height of each of which is 10~90% of the thickness T of a plated layer or 2~18μm, and covering said surface of said material that includes said grooves and ridge portions by metal plating.

A still further object of this invention is to provide, in producing a plated product in which the surface of a metallic or nonmetallic material is plated, an apparatus for forming grooves and their ridge portions on the surface of said material comprising a retainer means for retaining a cutting blade having a thickness of 3~95 μm so that the blade surface of said cutting blade is inclined to said surface of said material at angles within a range of more than 30 degrees, but less than 150 degrees, a material-fixing means to fix said material, a means for elevating or lowering said retainer means, a first moving means to move said retainer means in the direction in which the blade of said cutting blade is directed, and a second moving means to move said material-fixing means horizontally.

This invention provides a plated product comprising a material of which the surface has many recesses or grooves that have anchor portions. A part of a plating metal enters the recesses or grooves. Also, each groove can be provided with a ridge portions each of both edges of the opening of each groove. Therefore, the plating metal is made to strongly adhere to the material so that the plated product produced by this invention has a superior technical effect in that the thin film of metal tends to not peel off the surface of a material.

BRIEF DESCRIPTION OF THE DRAWINGS

FIGS. 2A and 2B are schematic front sectional views illustrating a result of conventional methods of roughening the surface of a material.

DESCRIPTION OF THE PREFERRED EMBODIMENTS

Embodiment 1

Figure 1A:
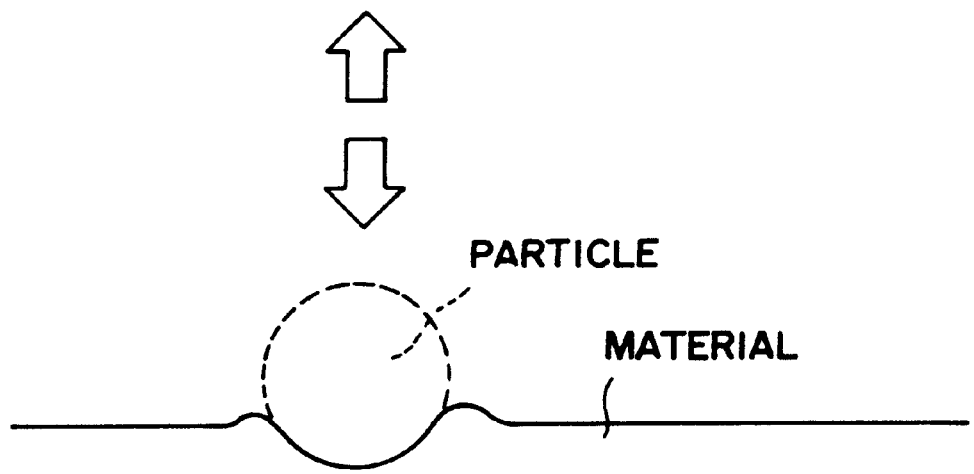
FIGS. 1A and 1B are schematic front views illustrating conventional methods of roughening the surfaces of a material.
Figure 1B:
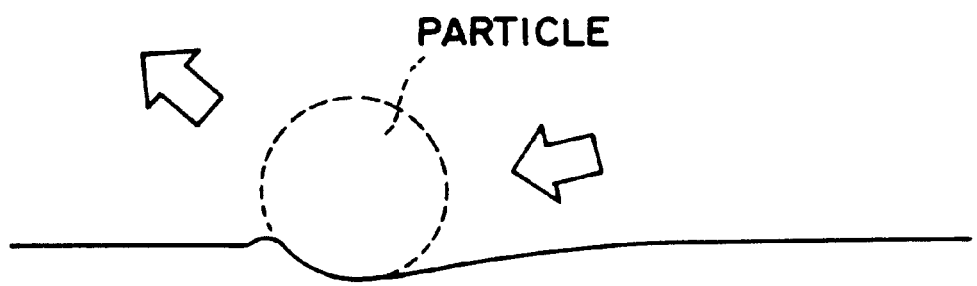
Figure 3:
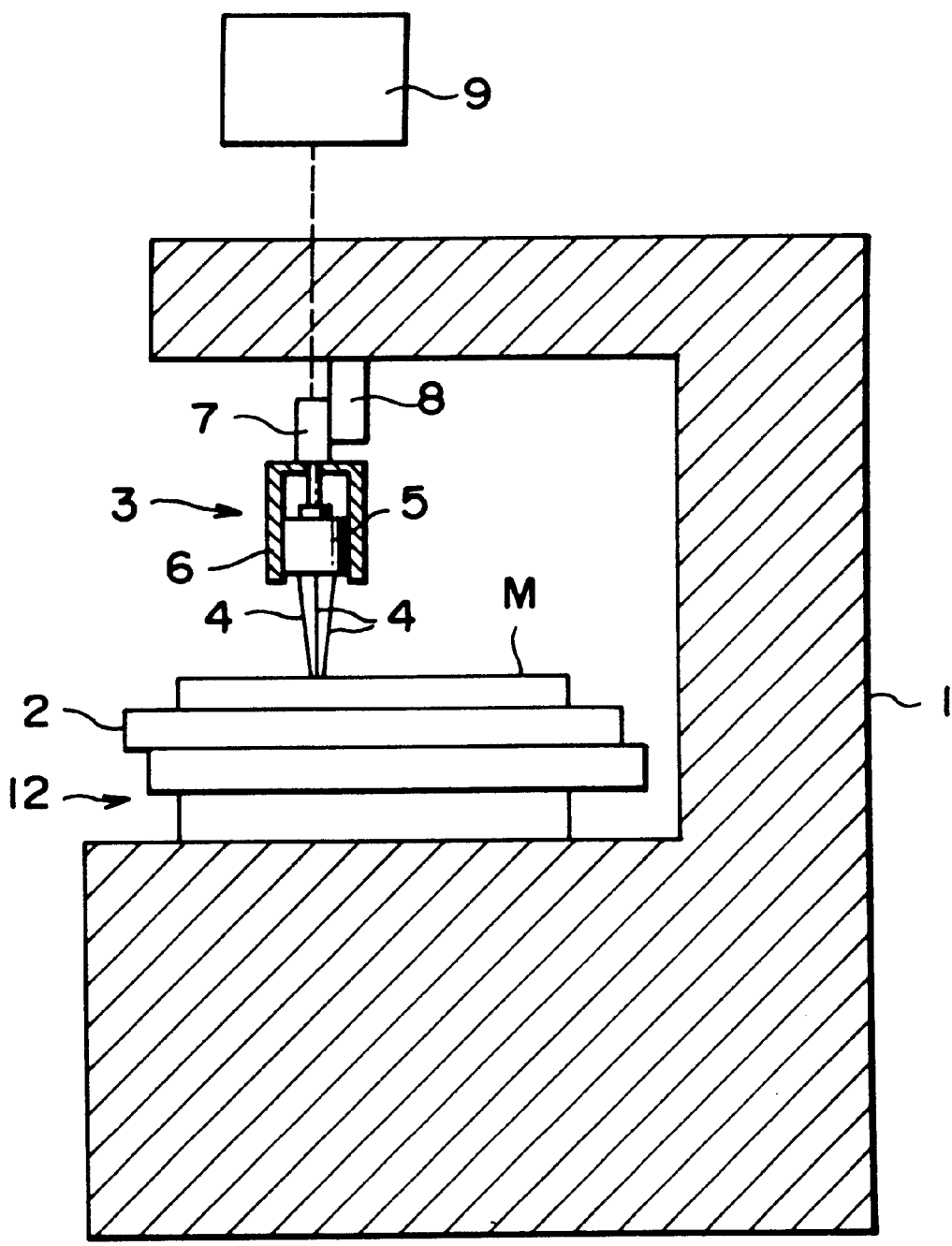
FIG. 3 is a partly-sectional front elevation that illustrates the first embodiment of this invention.
Figure 4:
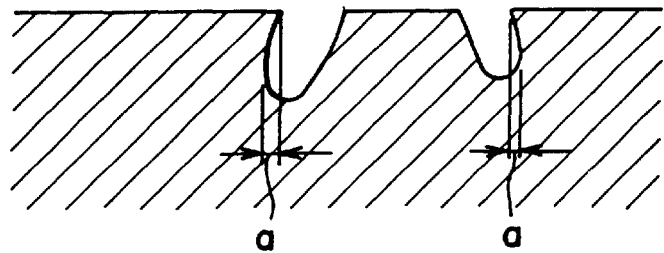
FIG. 4 is a schematic cross-sectional view of a material for illustrating grooves formed by the first embodiment of this invention.

Below, we explain, in detail, by referring to FIGS. 3 and 4, an apparatus to be used in a first embodiment that causes a needle to penetrate the surface of a material M, thereby roughening it. As in FIG. 3, a moving mechanism 12 is disposed on the lowermost part in the cavity of a column 1 C-shaped in cross-section. On the upper surface of the moving mechanism 12, a material-fixing-mechanism 2, which can fix the material M, is disposed. The moving mechanism 12 is adapted to move the material-fixing mechanism 2 in a horizontal plane.

A recess-forming mechanism 3 is disposed at a position just above the material-fixing-mechanism 2. The recess-forming mechanism 3 comprises a retainer 5, a mounting member 6, a motorized cylinder 7, and a mounting member 8. The cylinder 7 is mounted on the mounting member 8, which is mounted on the uppermost part within the cavity of the column 1. The retainer 5 is connected to the lower end of the piston rod of the cylinder 7, and adapted to be moved, through a guide member 6, by the actuation of the cylinder 7.

The retainer 5 can retain the base portions of a plurality of needles or drawn wires, each having a diameter of 3~95 μm, while the needles or wires are inclined at angles of less than 90 degrees, but more than 45 degrees, to the surface of the material. In this embodiment, four needles 4 are retained by the retainer 5. Two pairs of oppositely arranged needles are so arranged that each of four needles 4 is disposed at each of four vertexes of one square. Simultaneously, one pair of needles 4 are disposed on one of two diagonal lines of the square. In other words, the one pair of needles 4 are disposed on the diagonal line of the square such that they are oppositely positioned to each other at respective vertexes. Therefore, in FIG. 3 one needle 4 is behind the other needle. Thus, only three needles can be seen in FIG. 3. Each needle has a diameter of 8 μm, and is inclined at an angle of about 80 degrees to the surface of the material. The cylinder 7 can act as a means for elevating or lowering the retainer 5.

A controller 9, which is adapted for detecting a reaction force against the cylinder 7 so as to generate a command to control the descending force of the cylinder 7, is electrically connected to it.

By using the thus-constructed apparatus, the surface of the material M, an aluminum plate 10×60×1 (mm), was roughened for use as a plated product. The aluminum plate was fixed by the material-fixing mechanism 2. Then, the cylinder 7 was actuated so as to have the retainer 5 and the needles 4 descend, thereby causing the needles 4 to penetrate the surface of the aluminum plate. Usually, the stiffness of the aluminum plate is lower than that of the needles 4. Therefore, even when the four needles 4, inclined in different directions from each other, are urged to penetrate the plate, the plate suffers the plastic deformation while allowing the advance of the needles 4. Therefore, the tips of four needles 4 can penetrate the aluminum plate. However, each of recesses thus formed is somewhat deformed. Thereafter, the cylinder 7 was actuated to be retracted so as to have the needles 4 and the retainer 5 ascend, so that the needles 4 were withdrawn from the aluminum plate. Thus, a plurality of recesses, each having an anchor, on the surface of the aluminum plate, were obtained. Thereafter, the aluminum plate, provided with the recesses, was copper-plated to obtain a desired plated product. The aforesaid anchor portion means a hollow (a), i.e., as in FIG. 4, a part that is laterally hollowed out from a line which is drawn from the edge of the opening of a recess and that is perpendicular to the surface of a material.

In this embodiment, the number of penetrating needles per 1 $cm^2$ of the surface of the aluminum plate varies. The number of penetrating needles corresponds to the number of recesses. Each recess has an opening of 10 μm and a depth of 5 μm.

The plated plate was cut into a plurality of test pieces. Thereafter, bilaterally swinging fatigue tests (a repeated flex test) were carried out by bending each test piece 10,000 times. After each test a thin film of metal covering the surface of a piece was checked to see if there was a peeled part. The results are shown in Table 1.

TABLE 1

|  | Method of Roughening the Surface of a Material | Percentages of Test Pieces Having Peeled Parts |
| --- | --- | --- |
| Conventional Methods | Chemical Etching | More than 60% |
|  | Shot Peening (Surface Roughness 55 μm) | More than 50% |
|  | Shot Peening (Surface Roughness 8 μm) | More than 40% |
| This Invention | Number of Penetrating Needles (5,000/$cm^2$) | More than 35% |
|  | Number of Penetrating Needles (10,000/$cm^2$) | Less than 10% |
|  | Number of Penetrating Needles | Less than 1% |

TABLE 1-continued

| Method of Roughening the Surface of a Material | Percentages of Test Pieces Having Peeled Parts |
| --- | --- |
| 250,000/$cm^2$) | |

A certain degree of peeling occurred on less than 10% of the total test pieces that had recesses of 10,000/ $cm^2$, each recess being provided with an anchor. A certain degree of peeling occurred on less than 1% of the total test pieces that had recesses of 250,000/$cm^2$, each recess being provided with an anchor. A certain degree of peeling occurred on more than 35% of the total test pieces that had recesses of 5,000/$cm^2$, each being provided with an anchor. This type of test piece has no utility.

A preferable degree of peeling is less than 30% of the total test pieces. Table 1 shows that many recesses that each had an anchor portion provided on the surface of the aluminum plate caused a thin film of metal to be unlikely to be peeled off the aluminum plate.

Next, control tests by conventional methods, for comparing them with the results obtained from the first embodiment of this invention, were carried out. On an aluminum plate as used in the first embodiment, a chemical etching test and a shot peening test were carried out. The results are shown in Table 1.

As in Table 1, a certain degree of peeling occurred on more than 60% of the total test pieces which were roughened by a chemical etching. Also, a certain degree of peeling occurred on more than 50% of the total test pieces subjected to a shot peening and that had a surface roughness of 55 μm. Each test piece was roughened by causing shots, each 0.8 mm in diameter, to hit the test piece at a speed of 70 m/sec. Also, a certain degree of peeling occurred on more than 40% of the total test pieces subjected to a shot peening and that had a surface roughness of 8 μm. Each test piece was roughened by causing shots, each 0.2 mm in diameter, to hit the test piece at a speed of 30 m/sec.

In the first embodiment, the size of the opening of a recess and the depth of the recess were changed to have different values.

As a result, when the size of the opening of a recess was less than 5 μm, the binding power between the molecules of a thin film of metal was greater than that between the molecules of the thin film of metal and the aluminum plate, or was greater than the gravitational force affecting them. Therefore, the metal could not enter the recess of the aluminum plate. When the size of the opening of a recess was more than 100 μm, the metal was able to enter the recess of the material. However, in that case any part that adhered to the bottom surface of the recess resembled the case where the surface of the material that had no recess was covered. This led to the same result as in the conventional methods. Also, the adhesion properties were the same as in the conventional methods.

When the depth of a recess was less than 20 percent of the size of an opening, no good peeling resistance could be obtained, and the performance remained the same as that of the conventional methods. When the depth of the recess was more than the size of an opening, energy was needed to cause a needle or the like to penetrate the material. However, nevertheless this had no effect.

The size of a needle or drawn wire material to provide a recess that has an opening of 5 μm was about 3 μm. The size of a needle or drawn wire material to provide a recess that has an opening of 100 µm was about 95 µm. Therefore, to provide a recess that has an opening ranging from 5 µm to 100 µm, it is preferable to use a needle or drawn wire material that has a size of 3 µm to 95 µm in diameter.

When the angle of a needle or drawn wire material to the aluminum plate was less than 45 degrees or more than 90 degrees, the adhesion of the plating metal to the aluminum plate was poor.

Embodiment 2

Figure 5:
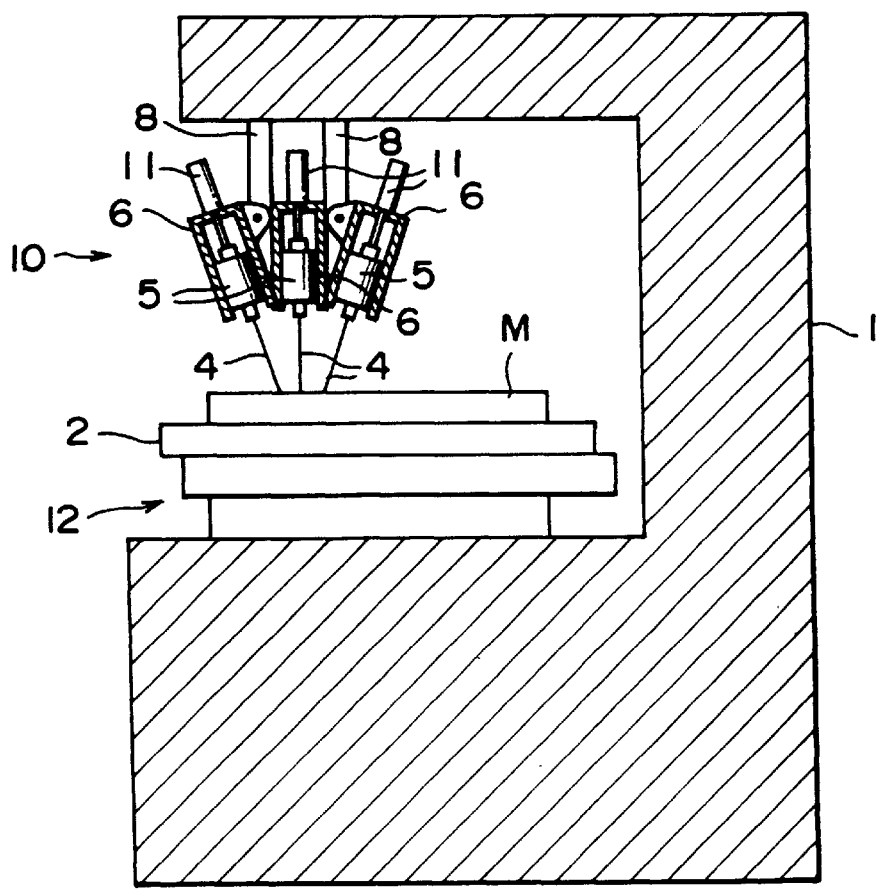
FIG. 5 is a schematic front elevation for illustrating the second embodiment of this invention.

Below, a second embodiment will be explained by referring to FIG. 5. In the second embodiment, the material-fixing mechanism 2 and the moving mechanism 12 were the same as those used in the first embodiment. However, in the second embodiment, a recess-forming mechanism 10 comprises two pairs of oppositely arranged retainers 5 and their related elements. One pair of retainers 5 and their related elements are so arranged that each retainer 5 and its related element of the pair are disposed at each vertex of one pair of opposing vertexes of one square. Simultaneously, the one pair of retainers 5 and their related elements are positioned on the diagonal line of the square connecting the opposing vertexes. Therefore, one retainer 5 of the pair and its related elements are behind the other retainer 5 and its related elements. Thus, only three retainers 5 and their related elements can be seen in FIG. 5. Each retainer 5 is connected to the lower end of the piston rod of a small motorized cylinder 11. The retainer 5 is adapted to ascend or descend through a guide member 6 by the actuation of the cylinder 11. The guide members 6 are mounted, by means of mounting members 8, on the uppermost part within the cavity of the column 1. A single needle 4 is retained by each retainer 5, while each needle is inclined at an angle of about 70 degrees to the surface of the material M. Each needle 4 can independently ascend or descend by means of each retainer 5, by the actuation of the cylinder 11.

In the second embodiment, the same technical effects as those obtained in the first embodiment were obtained.

Embodiment 3

Figure 6:
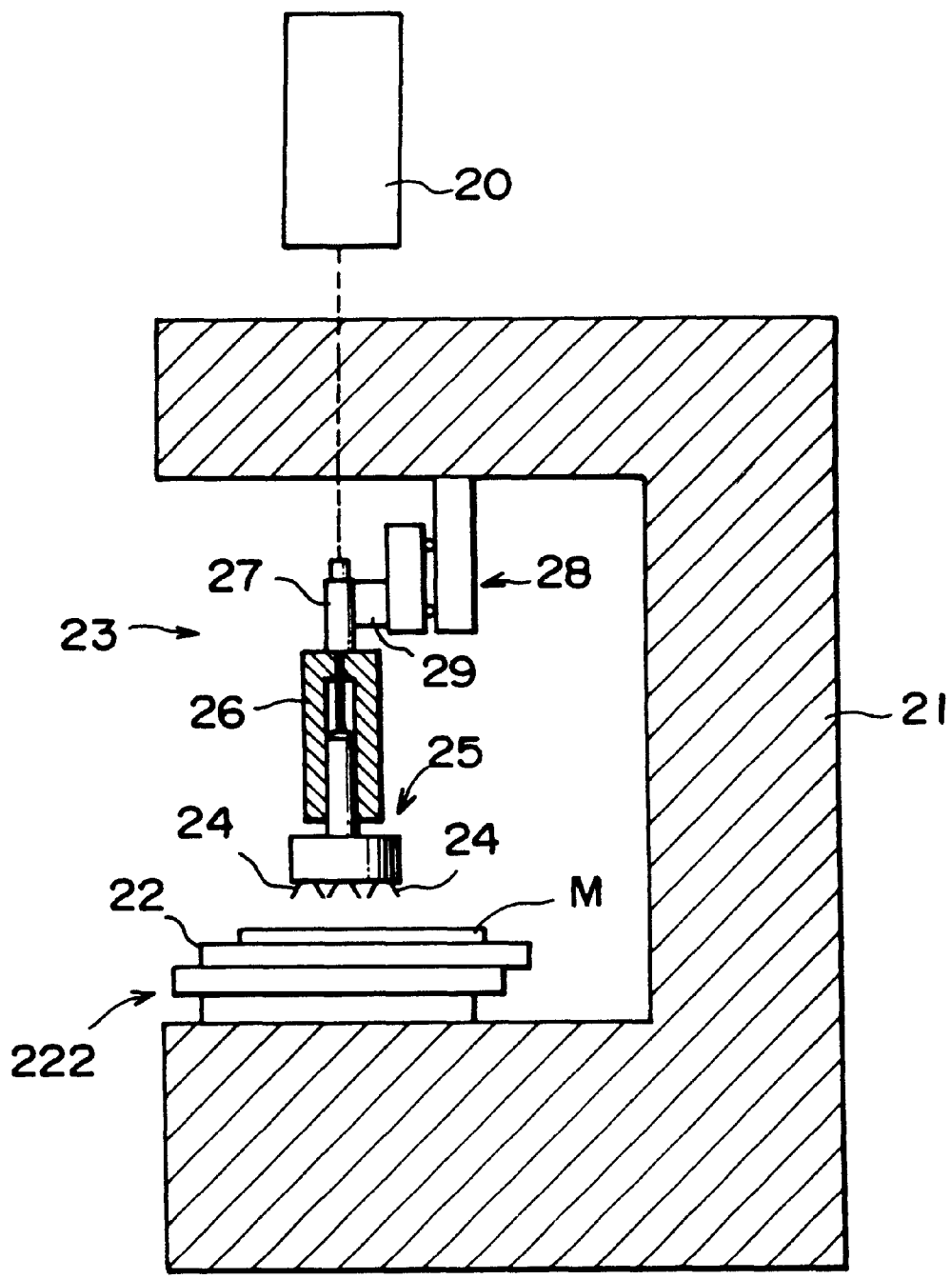
FIG. 6 is a schematic front elevation for illustrating the third embodiment of this invention.
Figure 7:
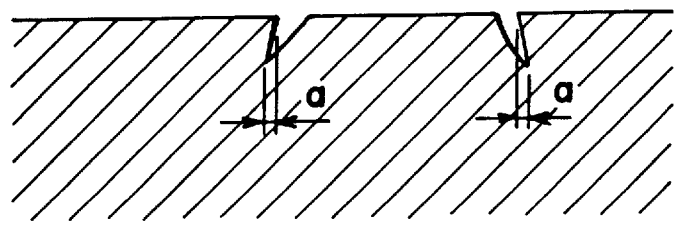
FIG. 7 is a schematic cross-sectional view for illustrating grooves formed by the third embodiment of this invention.

Next, we explain, in detail, by referring to FIGS. 6 and 7, an apparatus to be used in a third embodiment that causes razor-like cutting blades to penetrate the surface of an aluminum plate, to roughen it. As in FIG. 6, a moving mechanism 222 is disposed on the lowermost portion within the cavity of a C-shaped column 21. A material-fixing mechanism 22 for fixing a material M is disposed over the moving mechanism 222. The moving mechanism 222 acts as a second moving means and can move the material-fixing mechanism 22 in a horizontal plane.

A groove-forming mechanism 23 is disposed at a position just above the material-fixing mechanism 22 in the column 21. The groove-forming mechanism 23 comprises a motorized cylinder 27 mounted by means of a mounting member 29 on a moving mechanism 28, which acts as a first moving means and is mounted on the uppermost part within the cavity of the column 21, a guide member 26 disposed below the cylinder 27 and connected to the lower part of the cylinder 27, and a retainer 25 for retaining three pairs of razor-like cutting blades 24. The retainer 25 is connected to the lower end of the piston rod of a motorized cylinder 27. The base portions of the blades 24 can be retained by the retainer 25, so that each blade can incline to the surface of the material at angles of more than 45 degrees, but less than 90 degrees. In this embodiment each blade is inclined at an angle of about 60 degrees.

The retainer 25 is adapted to retain a razor-like cutting blade of a thickness of from 3 to 95 µm. In this embodiment a razor-like cutting blade having a thickness of 8 µm was used. The shape of the edge portion of each blade is acute-angled so as to give a cross-sectional shape to a groove in the material, as in FIG. 7. The cylinder 27 acts as a means for elevating or lowering the retainer 25 through a guide member 26. Therefore, the retainer 25 can be moved to ascend or descend by the actuation of the cylinder 27. The moving mechanism 28 is adapted to move the cylinder 27 horizontally so that the retainer 25 is caused to move backward or forward in the longitudinal direction of the razor-like cutting blade 4.

A controller 20 positioned above the column 21 is electrically connected to the motorized cylinder 27. The controller 20 acts as a control means to detect any reaction force against the motorized cylinder 27 so as to generate a command to control the pressing force of the cutting blades 4 on the material M.

By using the thus-constructed apparatus, the surface of the aluminum plate was roughened for use as a plated product. This roughening was done before the surface of the aluminum plate to be a plated product was plated.

First, the plate was fixed to the material-fixing mechanism 22. Then, the motorized cylinder 27 was actuated to extend so as to have the cutting blades 24, the retainer 25, and so forth, descend, under the control of the controller 20. This caused the cutting blades 24 to penetrate the surface of the plate in a desired depth. Thereafter, the cutting blades 24, the motorized cylinder 27, and so forth, were moved by the moving mechanism 28 in the longitudinal directions of the cutting blades 24 so that the surface of the plate was cut to form grooves thereon. When the cutting blades 24 were moved a predetermined distance, the motorized cylinder 27 was actuated to retract, to have the retainer means 25 and so forth ascend, thereby withdrawing the cutting blades 24 from the surface of the plate. Then, the plate was moved by the moving mechanism 222 in a predetermined direction.

By repeating this operation, many grooves on the aluminum plate were obtained that inclined to the surface of the surface of the plate at an angle of about 60 degrees. When the angle of a razor-like cutting blade to the aluminum plate was less than 45 degrees or more than 90 degrees, the adhesion of the plating metal to the aluminum plate was not good.

The pattern on the surface of the plate was in a lattice form. However, the pattern may be in a diamond form.

After this operation, the surface of the plate, provided with many grooves, was plated to obtain a plated product.

The cross-sectional shape of the groove obtained in this embodiment can be seen in FIG. 7. It had an anchor portion, which means a hollow (a), i.e., a part that is laterally hollowed out from a line which is drawn from the edge of the opening of the groove and that is perpendicular to the surface of the aluminum plate.

In this embodiment, 20 grooves per 1 cm were obtained. The size of the opening of each groove was 10 µm and the depth of it was 5 µm.

Then, the aluminum plate was copper-plated to make a test piece. The plated plate was cut into a plurality of test pieces.

Thereafter, bilaterally swinging fatigue tests (a repeated flex test) were carried out 10,000 times on each piece. After each test a thin film of metal covering the surface of a piece was checked to see if any peeled part was observable. The results are shown in Table 2.

TABLE 2

| | Method of Roughening the Surface of a Material | Percentages of Test Pieces Having Peeled Parts |
|---|---|---|
| Conventional Methods | Chemical Etching | More than 60% |
| | Shot Peening (Surface Roughness 55 µm) | More than 50% |
| | Shot Peening (Surface Roughness 8 µm) | More than 40% |
| This Invention | Cutting by Razor-Like Cutting Blades (Opening: 10 µm, Depth: 5 µm, Lattice Lines: 20/cm) | Less than 5% |

Since a part of the thin film of metal entered the anchor portions of the grooves, the plated product had been provided with the desired peeling resistance.

A certain degree of peeling occurred on less than 5% of the total test pieces prepared by this invention. Table 2 shows that a plurality of grooves, each groove being provided with an anchor portion as in FIG. 7, provided on the surface of a material, caused the thin film of plated metal hardly to peel off. The pattern provided on the surface of the material by those grooves that had an anchor portion may be in a lattice form or in a diamond form. They do not prevent the grooves from functioning as anchor portions. However, it is preferable that any two adjoining grooves be arranged not in parallel.

Next, control tests by conventional methods, for comparing them with the results obtained from the first embodiment of this invention, were carried out. On an aluminum plate as used in the third embodiment, a chemical etching test and a shot peening test were carried out. The results are shown in Table 2.

As in Table 2, a certain degree of peeling occurred on more than 60% of the total test pieces which were roughened by a chemical etching. Also, a certain degree of peeling occurred on more than 50% of the total test pieces that had a surface roughness of 55 µm. Each test piece was roughened by causing shots, each 0.8 mm in diameter, to hit the test piece at a speed of 70 m/sec. Also, a certain degree of peeling occurred on more than 40% of the total test pieces that had a surface roughness of 8 µm. Each test piece was roughened by causing shots, each 0.2 mm in diameter, to hit the test piece at a speed of 30 m/sec.

In this embodiment, when the width of the opening of a groove was less than 5 µm, the binding power between the molecules of a thin film of metal was greater than that between the molecules of the thin film of metal and the aluminum plate, or was greater than the gravitational force affecting them. Therefore, the metal could not enter the groove of the aluminum plate. When the width of the opening of a groove was more than 100 µm, the metal was able to enter the groove of the aluminum plate. However, in that case no part that adhered to the groove did so effectively function as in a groove that has an anchor portion. This resembled the case where the surface of the aluminum plate that had no groove is covered. This led to the same result as in the conventional methods. Also, the adhesion properties were the same as in the conventional methods.

The thickness of a razor-like cutting blade to provide a groove that has a width of an opening of 5 µm was about 3 µm. The thickness of the razor-like cutting blade to providing a groove that has a width of an opening of 100 µm was about 95 µm. Therefore, to provide a groove that has a width of an opening ranging from 5 µm to 100 µm, it is preferable to use a razor-like cutting blade that has a thickness of 3 µm to 95 µm.

When the depth of a groove was less than 20 percent of the width of the opening of the groove, the peeling resistance could not be improved, and the performance remained the same as in the conventional methods. When the depth of the groove was more than the width of an opening, energy was needed to cause a cutting blade to penetrate the material. However, nevertheless this had no such a good effect as a groove that has an anchor portion.

Embodiment 4

Figure 8:
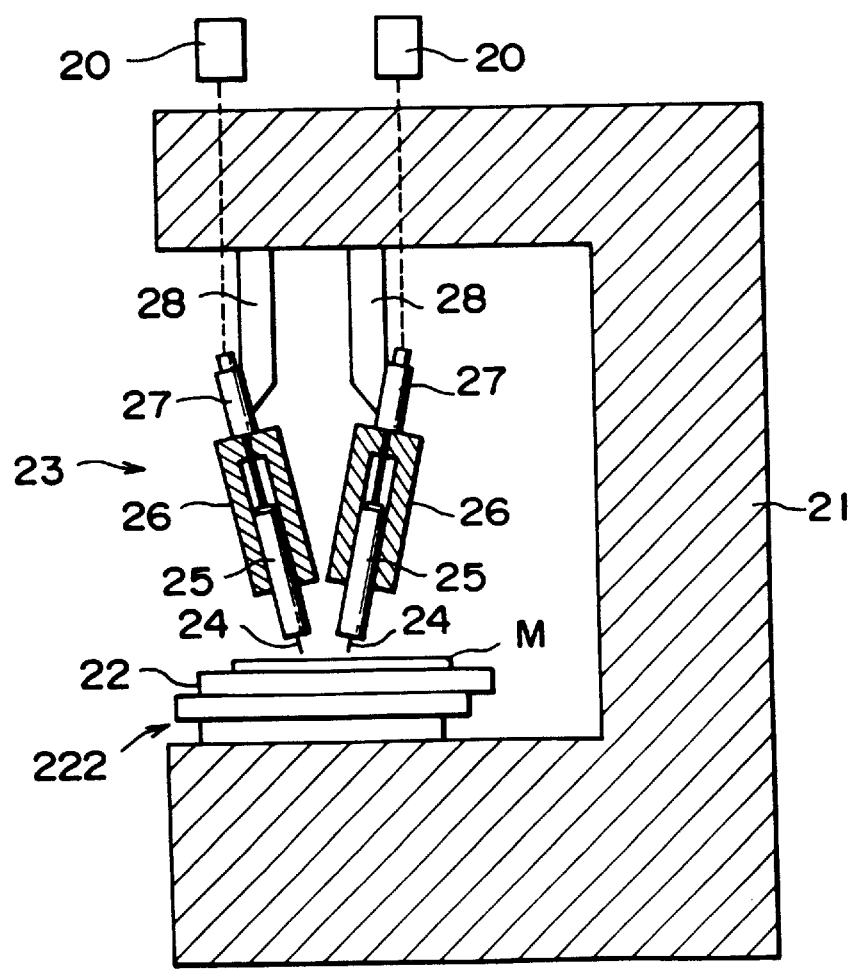
FIG. 8 is a schematic front elevation for illustrating the fourth embodiment of this invention.

Below is a fourth embodiment of this invention. In this embodiment, as in FIG. 8, a single-blade construction was used. In it a groove-forming mechanism 23 comprises two set of retainers 25 and their related elements. Each cutting blade 24 is retained by each retainer 25, each being adapted to ascend or descend by the actuation of each motorized cylinder 27. Each cylinder 27 is mounted by means of a mounting member 28 on the uppermost part within the cavity of a C-shaped column 21.

Each cutting blade 24 can independently ascend or descend. In this case the pattern formed by grooves on the surface of the material was zigzag. The cutting blade was of a razor-like form. However, it is not limited to that form, if it has a high stiffness. For instance, a band-plate having a narrow width can be used. In this embodiment, each blade 24 was arranged to incline at an angle of about 80 degrees. However, the groove-forming mechanism 23 can be arranged so that each blade 24 is inclined at angles in a range from 45 degrees to 90 degrees to the surface of the material. As a means for elevating or lowering the retainer, the motorized cylinder 27 was used in this embodiment. However, it is not limited to a motorized cylinder. For instance, a hydraulic cylinder can be used.

Embodiment 5

Figure 9:
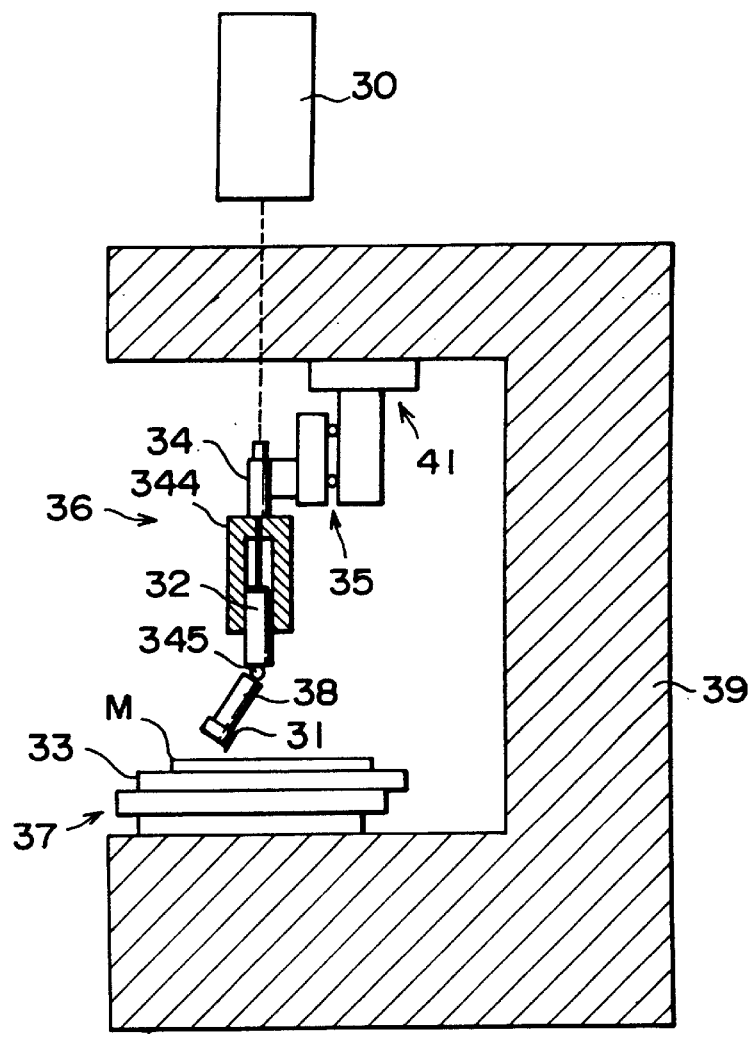
FIG. 9 is a schematic front elevation for illustrating the fifth embodiment of this invention.

Below is a fifth embodiment of this invention. In this embodiment, as in FIG. 9, an apparatus to form grooves and ridges on the surface of an aluminum plate 10×60×1 (mm) is provided. In it a rotary-disk cutting blade 31 can be rotated and horizontally moved on the surface of the aluminum plate while the blade is pressed against the surface, to roughen it.

The apparatus comprises a groove-forming mechanism 36, a material-fixing mechanism 33, and a moving means 37. The moving means 37 acts as a second moving means. The groove-forming mechanism 36 comprises a moving mechanism 35, which acts as a first moving means, a retainer 32 to retain a pneumatic motor 38 via a universal coupling 345, a motorized cylinder 34 to have the retainer 32 ascend or descend, a guide member 344, and a horizontally-moving mechanism 41 mounted on the uppermost part within the cavity of a C-shaped column 39. The motorized cylinder 34 is mounted on the moving mechanism 35, which is mounted on the horizontally-moving mechanism 41. To the lower end of the piston rod of the motorized cylinder 34, the retainer 32 is connected. The retainer 32 can be moved up or down within the guide member 344. The rotary-disc cutting blade 31 has a diameter of 20 mm and a thickness of 8 µm.

The rotary-disk cutting blade 31 is rotatably mounted on the lower end of the pneumatic motor 38. By the universal-coupling 345, the pneumatic motor 38 and the blade 31 can incline to the surface of the aluminum plate, at angles from 30 to 150 degrees. In this embodiment the surface of the blade 31 was inclined at an angle of about 60 degrees. The moving means 35 is adapted to move the motorized cylinder 34 and the retainer 32 in the direction that the blade of the rotary-disk cutting blade is directed. The moving mechanism 37 is adapted to horizontally move the material-fixing means 33. The horizontally-moving mechanism 41 is adapted to horizontally move the cylinder 34 and its related parts.

Above the column 39, a controller 30 is disposed. It is electrically connected to the motorized cylinder 34, and acts as a control means. It can detect a reaction force against the cylinder 4 so as to generate a command to control the pressing force of the rotary-disc blade 31 on the aluminum plate.

Below is explained the method of roughening the surface of the aluminum plate, using the thus-constructed apparatus. This roughening was done before the surface of the aluminum plate was plated to form a plated product.

First, the aluminum plate was fixed to the material-fixing means 33. Then, compressed air was supplied to the pneumatic motor 38 to rotate the rotary-disk cutting blade 31. Thereafter, the motorized cylinder 34 was actuated to have its piston rod extend so as to have the rotary-disk cutting blade 31, the air motor 38, the retainer 32, and so forth, descend, under the control of the controller 30. This caused the rotary-disk cutting blade 31 to press the surface of the aluminum plate by a force of a specified degree. Then, the rotary-disk cutting blade 31, the air motor 8, and so forth, were moved by the moving mechanism 35 in the direction that the rotary-disk cutting blade 31 was rotated. Thus, the surface of the aluminum plate was cut to form grooves thereon.

When the cutting blade 31 was moved a predetermined distance, the motorized cylinder 34 was actuated to retract, to have the retainer 32 and so forth ascend, thereby separating the rotary-disk cutting blade 31 from the aluminum plate. Then, the aluminum plate was moved by the moving mechanism 37 in a predetermined direction. If desired, the retainer 32, the rotary-disk cutting blade 31, and so forth, can be horizontally rotated by the horizontally-moving mechanism 41. Thus, the movements of the rotary-disk cutting blade 31 caused the aluminum plate to be cut to form grooves.

Figure 10:
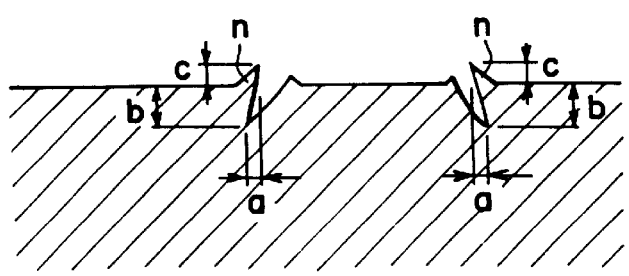
FIG. 10 is a schematic cross-sectional view for illustrating grooves and their ridge portions formed by the fifth embodiment of this invention.

Simultaneously with the cutting of grooves, as in FIG. 10, a part of the aluminum plate was raised by the rotary-disk cutting blade 31 to form ridge portions (n) at both edges of the opening of the groove.

By repeating this operation, many grooves were formed that inclined to the surface of the aluminum plate at an angle of about 60 degrees. Further, ridge portions were formed along the edges of the openings of the grooves. The pattern by the grooves on the surface of the material was in a lattice form. However, the pattern may be in a diamond form.

After the operation, the surface of the aluminum plate, provided with many grooves and ridge portions, was plated to obtain a plated product. Since a part of the thin film of metal entered each groove so that the anchor portion strongly grasped the metal entered therein, the plated product was provided with the desired peeling resistance.

The aforesaid anchor portion means a hollow (a), i.e., as in FIG. 10, a part that is laterally hollowed out from a line which is drawn from the edge of the opening of a groove and that is perpendicular to the surface of the aluminum plate. Also, (b) denotes the depth of a groove, and (c) denotes the height of the ridge portion of the groove.

When the angle of the rotary-disk cutting blade to the surface of the aluminum plate was less than 30 degrees, the adhesion of the plating metal to the aluminum plate was poor. When the angle of the rotary-disk cutting blade to the surface the aluminum plate was more than 150 degrees, the adhesion of the plating metal to the aluminum plate was also poor. Therefore, preferably the angle of the cutting blade to the surface of a material ranges from 30 to 150 degrees. The cross-sectional shape of the groove obtained in this embodiment can be seen in FIG. 10. The width of the opening of the groove was 10 m, the depth of it was 8 $\mu$m, and the height of the ridge portion was 4 $\mu$m. There were 20 grooves per 1 cm. The pattern of the grooves on the aluminum plate was in a lattice form.

After the cutting operation, the aluminum plate was copper-plated to make test pieces.

Then, bilaterally swinging fatigue tests (a repeated flex test) were carried out 10,000 times on each piece. After each test a thin film of metal covering the surface of a piece was checked to see if any peeled part was observable. The results are shown in Table 3.

TABLE 3

| | Method of Roughening the Surface of a Material | Percentages of Test Pieces Having Peeled Parts |
|---|---|---|
| Conventional Methods | Chemical Etching | More than 65% |
| | Shot Peening (Surface Roughness 60 $\mu$m) | More than 55% |
| | Shot Peening (Surface Roughness 120 $\mu$m) | More than 45% |
| This Invention | Cutting by Rotary-Disk Cutting Blades (Depth: 8 $\mu$m, Height: 4 $\mu$m, Lattice lines: 20/cm) | Less than 5% |

A certain degree of peeling occurred on less than 5% of the total test pieces prepared by this invention. Table 1 shows that a plurality of grooves, each groove being provided with anchor portions (n) as in FIG. 10, provided on the surface of a material, caused the thin film of metal to hardly peel off. When the groove and its ridge portion were made to be in a curved form, or in a different combined form, the same results were obtained. Also, when the depth of the groove and the height of the ridge portion of the groove were changed within a predetermined range, the same results were obtained.

As in Table 3, a certain degree of peeling occurred on more than 65% of the total test pieces which were roughened by a chemical etching. Also, a certain degree of peeling occurred on more than 55% of the total test pieces that had a surface roughness of 60$\mu$m. Each test piece was roughened by peening, with each shot being 0.8 mm in diameter, to hit the test piece at a speed of 70 m/sec. Also, a certain degree of peeling occurred on more than 45% of the total test pieces that had a surface roughness of 12$\mu$m. Each test piece was roughened by causing shots, each 0.2 mm in diameter, to hit the test piece at a speed of 30 m/sec.

In this embodiment, when the width of the opening of a groove is less than 5 $\mu$m, the binding power between the molecules of a thin film of metal is greater than that between the molecules of the thin film of metal and the material, or is greater than the gravitational force affecting them. Therefore, the metal cannot enter the groove of the aluminum plate. When the width of the opening of a groove is more than 100 $\mu$m, the metal can enter the groove of the material. However, in that case any part that adheres to the groove does not so effectively function as a groove that has an anchor portion. This resembles the case where the surface of the aluminum plate that has no groove is covered. This leads to the same result as in the conventional methods.

Also, the adhesion properties are the same as in the conventional methods.

The thickness of a rotary-disc cutting blade to provide a groove that has the width of the opening of a groove of 5 µm was about 3 µm. The thickness of the rotary-disc cutting blade to provide a groove that has the width of the opening of a groove of 100 µm was about 95 µm. Therefore, to provide a groove that has the width of the opening of a groove ranging from 5 µm to 100 µm, it is preferable to use a rotary-disc cutting blade that has a thickness of 3 µm to 95 µm.

When the depth of a groove and the height of the ridge portion of the groove are less than 10 percent of the thickness of a plated layer, especially the shearing force at the contact area of the plating is weakened. This results in fewer anchor effects. When the depth of the groove and the height of the ridge portion of the groove are more than the thickness of the plated layer, the metal can enter the groove. Therefore, preferably the depth of a groove and the height of the ridge portion of the groove are less than 90 percent of the thickness of a plated layer.

However, when the thickness of the plated layer at a portion where the ridge portion of a groove is located is high, the plated layer becomes uneven. Also, the binding power between the metal and the aluminum plate at that portion is weak.

Therefore, the plating metal that adheres to the groove has less effect to function as in a groove that has an anchor portion. This results in a plated layer that tends to be easily broken.

Generally, the thickness of a plated layer ranges from 10 to 20 µm. To obtain a good plated layer, the depth of a groove and the angle of the groove to the surface of a material should range from 2 to 18 µm, and from 30 to 150 degrees, respectively.

The pattern provided on the surface of the aluminum plate by the grooves and their ridge portions was in a lattice form. However, it may be in a diamond form. Neither prevents the grooves or their ridge portions from functioning as anchor portions. However, it is preferable that any two adjoining grooves be arranged not in parallel in the cross section of the aluminum plate.

The grooves and their ridge portions can be linear or curved, or in a combined form. The depth of a groove and the height of the ridge of the groove can be varied within a predetermined range.

Further, the height of the ridge portion of a groove is preferably lower than the depth of the groove. As a means to form a groove and its ridge portion, any cutting blade that has a stiffness of a certain degree can be used. For instance, a razor-like blade, a band-plate having a narrow width, or a rotary-disk cutting blade having a desired thickness and diameter, can be preferably used. This cutting blade is caused to be pressed with a desired pressure against the surface of a material while the blade is moved, so that the surface of the material is cut or carved.

In the above embodiment, the rotary-disk cutting blade 31 was rotated by the pneumatic motor 38. However, in place of it, an electric motor can be used to rotate it. It will cause the same operation and effects as those caused by the pneumatic motor 38.

Also, the motorized cylinder 34 was used as an elevating or lowering means. However, the means is not limited to a motorized cylinder. For instance, a hydraulic cylinder can be used.

As will be understood from the above explanation, by the fifth embodiment of this invention a plurality of grooves are formed on the surface of a material. The width of the opening of each groove is 5~100 µm and the depth of each groove is 10~90% of the thickness T of a plated layer. The angle of each groove to the surface of the material is within a range of more than 30 degrees, but less than 150 degrees. Each groove is provided at each of both edges of its opening with a ridge portion, the height of which is 10~90% of the thickness T of the plated layer. A part of the thin film of metal enters the anchor portion of the groove. Therefore, the thin film of metal hardly peels off the surface of the material, as compared with the conventional plated products.

Thus, this invention provides a plated product comprising a material of which the surface has many recesses or grooves that have anchor portions. Therefore, a part of a plating metal enters the anchor portions of the recesses or grooves. Since the anchor portions firmly grasp the plating metal entered, the plated metal of the product resists the force applied in a direction at substantially right angles, so as to prevent the plated metal from peeling off. Also, each of the grooves on the surface of the material can be provided with a ridge portion at each of both edges of its opening. Therefore, the plated metal that covers the grooves and ridge portions of the material also resists the force applied in a direction substantially parallel to the surface of the material so as to prevent the plated metal from peeling off. Therefore, the plated product produced by this invention has a superior technical effect in that the thin film of metal tends to not peel off the surface of a material.

What is claimed is:

1. An apparatus for forming many recesses on a surface of a nonmetallic or metallic material for a plated product, comprising a needle or a drawn wire material of a diameter of 3~95 µm, a retainer means for retaining the base portion of said needle or said drawn wire material so that said needle or drawn wire material is inclined at angles of more than 45 degrees, but less than 90 degrees, to said surface of said material, a material-fixing means to fix the material, and a means for elevating or lowering said retainer means.

2. The apparatus of claim 1, wherein said apparatus further comprises a controller for detecting a reaction force against said elevating or lowering means so as to generate a command to control the descending force of said elevating or lowering means.

3. An apparatus for forming a plurality of grooves on the surface of a nonmetallic or metallic material for a plated product, comprising a cutting blade having thickness of 3~95 µm, a retainer means for retaining the base portion of said cutting blade so that said cutting blade is inclined to said surface of said material at angles within a range of more than 45 degrees, but less than 90 degrees, a material-fixing means to fix said material, a means for elevating or lowering said retainer, a first moving means to move said retainer means in the direction that the blade of said cutting blade is directed, and a second moving means to move said material-fixing means horizontally.

4. The apparatus of claim 3 further comprising a control means for controlling a pressing force of said cutting blade against said surface of said material.

5. An apparatus for forming grooves and their ridge portions on the surface of a metallic material or nonmetallic material for a plated product, comprising a cutting blade having a thickness of 3~95 µm, a retainer means for retaining said cutting blade so that the blade surface of said cutting blade is inclined to said surface of said material at angles within a range of more than 30 degrees, but less than 150 degrees, a material-fixing means to fix said material, a means for elevating or lowering said retainer means, a first moving means to move said retainer means in the direction in which the blade of said cutting blade is directed, and a second moving means to move said material-fixing means horizontally.

6. The apparatus of claim 5 further comprising a control means for controlling a pressing force of said cuffing blade against said surface of said material.

* * * * *